(12) United States Patent
Yen et al.

(10) Patent No.: US 6,233,039 B1
(45) Date of Patent: *May 15, 2001

(54) OPTICAL ILLUMINATION SYSTEM AND ASSOCIATED EXPOSURE APPARATUS

(75) Inventors: Anthony Yen, Dallas, TX (US); Barundeb Dutta, Leuven (BE)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/085,970

(22) Filed: May 27, 1998

Related U.S. Application Data

(60) Provisional application No. 60/048,748, filed on Jun. 5, 1997.

(51) Int. Cl.[7] .............. G03B 27/42; G03B 27/72
(52) U.S. Cl. ................ 355/53; 355/67; 355/70; 362/259
(58) Field of Search .............. 355/53, 67, 70, 355/71, 69; 349/4; 347/238; 362/259

(56) References Cited

U.S. PATENT DOCUMENTS

| 4,050,814 | * 9/1977 | McFadden | 355/71 |
|---|---|---|---|
| 5,091,744 | 2/1992 | Omata | 355/53 |
| 5,343,271 | 8/1994 | Morishige | 355/53 |
| 5,453,814 | 9/1995 | Aiyer | 355/70 |
| 5,473,409 | * 12/1995 | Takeda et al. | 355/53 |
| 5,808,656 | * 9/1998 | Goldman | 347/238 |
| 5,838,709 | * 11/1998 | Owa | 372/68 |
| 6,002,466 | * 12/1999 | Brauch et al. | 355/53 |

* cited by examiner

Primary Examiner—Alan A. Mathews
(74) Attorney, Agent, or Firm—Mark A. Valetti; Wade James Brady, III; Frederick J. Telecky, Jr.

(57) ABSTRACT

An embodiment of the instant invention is an optical illumination system for illuminating the mask of an exposure apparatus for transferring the image of the pattern on the mask onto the semiconductor wafer, the optical illumination system comprising: illumination means (illumination means 45 of FIG. 3) comprised of a plurality of light sources for emitting light beams along beam paths; and a lens system (lenses 55 and 57 of FIG. 3) for focusing the light beams to the wafer, the lens system comprising at least one lens element positioned in the beams paths. Preferably, the light sources are individually addressable point like sources, and the optical illumination system further comprising a light control means for operating each of the light sources independently of the others. The plurality of light sources is, preferably, comprised of a matrix addressable array of electro-optic modulators (preferably comprised of LCD modulators); an array of semiconductor lasers (preferably an array of Vertical Cavity Surface Emitting Lasers); or an array of bonded edge emitting DFB lasers.

13 Claims, 2 Drawing Sheets

OPTICAL ILLUMINATION SYSTEM AND ASSOCIATED EXPOSURE APPARATUS

CROSS REFERENCE TO PRIOR APPLICATIONS

This application claims priority under 35 U.S.C. 119 based Provisional Application Ser. No. 60/048,748, filed Jun. 5, 1997.

FIELD OF THE INVENTION

This invention relates to an optical illumination system for illuminating a mask in an exposure apparatus for transferring the image of the pattern on the mask to a semiconductor substrate. This invention also relates to an exposure apparatus comprising such an optical illumination system.

BACKGROUND OF THE INVENTION

A primary objective of photo microlithography is to create images of the finest detail possible. High resolution images having extremely narrow line and space widths permit manufacture of complex integrated circuits on chips of small size.

To form a pattern on a semiconductor chip, light is transmitted through a planar mask and projected onto a planar wafer by a projection lens that generates a reduced image of patterns on the mask onto the wafer. Light in the projected image causes a chemical reaction in photosensitive material (photoresist) coated on the wafer, such that a relief image of the mask is created on the wafer. Illumination of the mask plane and of the wafer plane must be uniform, avoiding both small, local variations, and broad macroscopic variations across either plane.

In lithographic processes for the fabrication of semiconductor devices, a mask pattern is transferred to a substrate by the projection method for the sake of increased yield of products and better resolution. In the projection method, as the consequence of a trade-off between the resolution of the transferred pattern and the size of an area exposed in each exposure operation, it is prevailing to employ a step-and-repeat or scan-and-repeat technique with an apparatus called a stepper or a scanner which accomplishes exposure of the entire area of the substrate by repeating the sequence of making an exposure on a limited area of the substrate, then moving the substrate a predetermined distance and making another exposure.

Recent trends of further miniaturization of the patterns on an integrated circuit have forced development of optical lithography using light in the deep UV region, i.e. having a wavelength in the range of 190 to 330 nm. In such optical lithography, a super Hg lamp or an Xe-Hg lamp is often used as the light source. Since, however, the Hg lamp or Xe-Hg lamp has substantially no directionality and provides poor luminance, use of such lamps as the light source results in prolonged exposure time and, thus, in a decreased throughput Development of advanced lasers which can provide laser beams in shorter wavelength regions, such as solid state lasers and excimer lasers make it possible to introduce laser energy of high luminance in the deep UV region into an exposure apparatus for the manufacture of semiconductor circuit devices. In addition, laser diodes in the ultraviolet have already been demonstrated in laboratory settings. GaN lasers lasing at approximately 360 nm have been demonstrated.

One of the main problems with conventional steppers (or scanners) is the lack of good control of the light source illuminating the mask, which due to the high numerical aperture (NA) and high resolution of the current exposure tools has become an extremely important issue. In conventional tools, mask illumination is provided (or their equivalent) by light emerging from a two-dimensional array of lens lets which is in turn illuminated by a Hg arc lamp or an eximer laser through an assembly of optics in between. Hence, it is relatively difficult to configure the light source into various shapes for improved resolution and depth of focus with regards to exposing different patterns since it is difficult to turn on/off light from each lenslet separately

SUMMARY OF THE INVENTION

The optical illumination system and the exposure apparatus of the instant invention includes an illumination means which is comprised of a plurality of light sources for emitting light beams along beam paths, and a lens system for irradiating the object with the light beams. Preferably the lens system includes at least one lens element positioned in the beams paths. The light sources of the invention are preferably individually addressable point like sources.

The improvement is the use of various matrix addressable sources or integrated-modulators in a manner such that the ability to switch the independent pixels leads to a change in the shape of the source thus enabling the source to be used at higher resolution and varying illumination configurations. This can be achieved using arrays of laser diodes or using arrays of modulators of 10's of microns size devices.

Since the laser diodes in the array are individually addressable, instant source reconfiguration can be obtained to provide any type of illumination such as annular, quadrupole, and modified quadrupole. These types of illumination matter can be used to increase the resolution and depth of focus of the exposured relief images in photoresist.

In addition, the lack of aberration control in a high NA lens can be addressed by varying the partial coherence of the illumination system since aberrations of the imaging system is influenced by the partial coherence through the Hopkins formula.

An embodiment of the optical illumination system and the exposure apparatus according to the invention is characterized in that the optical illumination system comprises light control means for operating each of said light sources independently of the others. Another embodiment of the optical illumination system and the exposure apparatus of the instant invention is characterized in that the light sources comprise a matrix addressable array of electro-optic modulators, preferably an array of LCD modulator. Such an array of modulators provide the ability to switch the shape of the illumination and would allow a very flexible approach to achieving various illumination geometries.

Other embodiments of the optical illumination system and the exposure apparatus according to the instant invention are characterized in that the light sources comprise an array of semiconductor-based Light Energy Diodes, semiconductor lasers, preferably in the form of Vertical Cavity Surface Emitting Lasers (VCSELs) or an array of bonded edge emitting DFB lasers. VCSELs have the ability of providing in a very small area a large number of micro lasers defined by lithographic techniques.

These semiconductor laser arrays certainly have the potential to replace the light source of the most commonly used imaging tools—i-line steppers (which use filtered output of a mercury arc lamp, at 365 nm). Their main advantages compared with conventional light sources (arc lamps, excimer lasers, etc) are:

Increase in tool throughput due to the increase in light power delivered to the mask plane. To date, the best excimer laser outputs (after linewidth narrowing) about 10 W, whereas a single element in the array can easily produce 100 mW; Hence, for a 20×20 array, the system according to the invention will get 4 times more power;

Instant source reconfiguration to provide any type of illumination such as annular, quadrupole, and modified quadrupole used to increase the resolution and depth of focus of the exposed pattern; This is possible since the elements in the array are individually addressable; With conventional light sources, a lot of optics are needed to create different intensity profiles;

Simplification in illuminator design and fabrication, also eliminating mechanical failure possible in conventional designs;

Simplification in design and fabrication of the imaging lens. Currently, in the case of mercury arc lamp light sources, the imaging lens must provide for correction of chromatic aberration, since the mercury spectra lines such as i-line (365 nm, obtained after filtering the light source) are not sharp enough (bandwidth about 10 nm); Not having to correct for chromatic aberration translates to savings in cost and ease in imaging lens fabrication (the lens cost is about ⅓ the cost of the exposure tool);

Increase in power efficiency; Overall efficiencies of laser diodes can reach 20%, much higher than any mercury arc lamp after filtering and excimer laser after linewidth narrowing (both filtering and linewidth narrowing are needed to narrow the output bandwidth of the light source) thus create energy savings;

Reduction in operating cost; A mercury lamp costs about $3000 and lasts only about two months (1440 hours); Solid-state lasers can survive years of continuous operation; and Low voltage operation, a plus in safety.

An embodiment of the instant invention is an optical illumination system for illuminating the mask of an exposure apparatus for transferring the image of the pattern on the mask (the object) onto a substrate, the optical illumination system comprising: illumination means comprised of a plurality of light sources for emitting light beams along beam paths; and a lens system for focusing the light beams to the wafer, the lens system comprising at least one lens element positioned in the beams paths. Preferably, the light sources are individually addressable point like sources, and the optical illumination system further comprising a light control means for operating each of the light sources independently of the others. The plurality of light sources is, preferably, comprised of a matrix addressable array of electro-optic modulators (preferably comprised of LCD modulators); an array of semiconductor lasers (preferably an array of Vertical Cavity Surface Emitting Lasers); or an array of bonded edge emitting DFB lasers.

Another embodiment of the instant invention is an exposure apparatus for forming a pattern on a photoresist layer formed over a semiconductor substrate, the exposure apparatus comprising: illumination means for illuminating a mask in the exposure apparatus, the illumination means comprising a plurality of light sources for emitting energy beams along beam paths; a lens system for transferring the pattern of the mask onto the photoresist layer, the lens system comprising lens elements distributed along the beams paths; and wherein the light sources are individually addressable point like sources. Preferaby, the exposure apparatus of the instant invention further comprises a light control means for operating each of the light sources independently of the others. The plurality of light sources is, preferably, comprised of: a matrix addressable array of electro-optic modulators (preferably LCD modulators); an array of semiconductor lasers (preferably an array of Vertical Cavity Surface Emitting Lasers); or an array of bonded edge emitting DFB lasers.

DETAILED DESCRIPTION OF A PREFERRED EMBODIMENT

Figure 1:
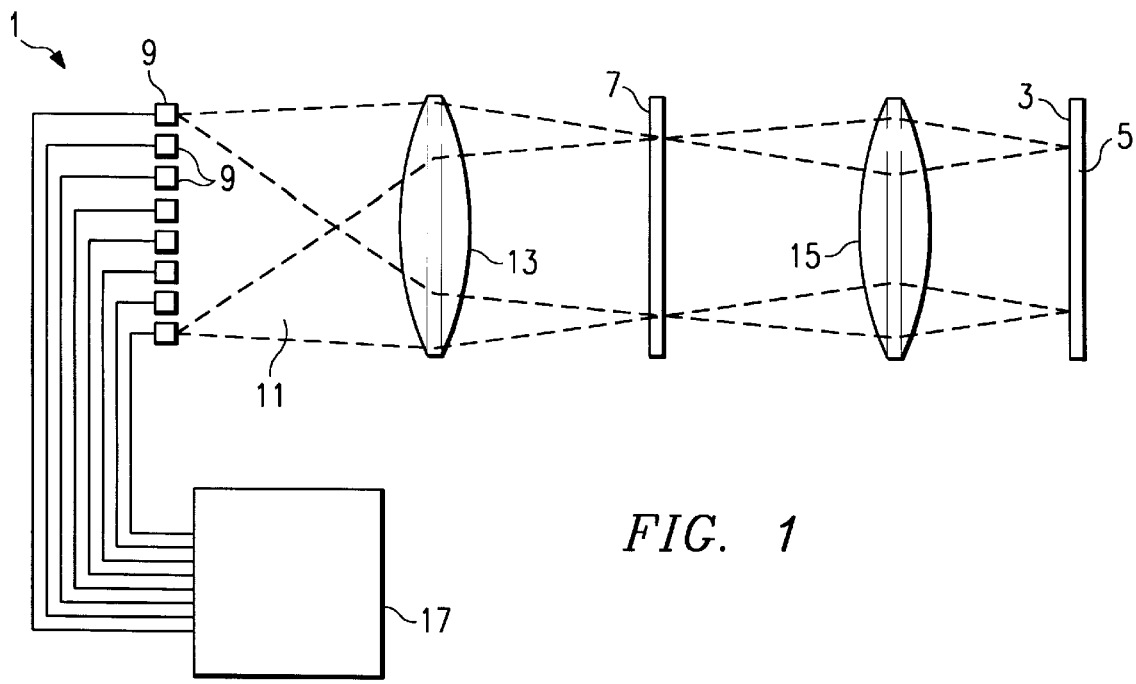
FIG. 1 is a schematic illustration of an optical illumination system according to the present invention

FIG. 1 illustrates schematically, an embodiment of the exposure apparatus having an optical illumination system in accordance with the instant invention. The exposure apparatus 1 forms a pattern, on a photoresist layer 3 on a substrate 5. Exposure apparatus 1 includes illumination means for illuminating a mask 7 present in the exposure apparatus. The illumination means is comprised of a plurality of light sources 9, which emit beams 11 along beam paths, and a lens system, which is comprised of a lens element 13 for irradiating the mask 7 with the light beams 11. A further lens element 15 transfers the pattern of the mask 7 onto the substrate 5. The light sources 9 of the illumination system according to the present invention are preferably individually addressable. To control these individually addressable light sources 9 the illumination system comprises light control means 17 for operating each of said light sources independently of the others.

The illumination system may comprise a matrix addressable array of LCD's or other electro-optic modulators. Such an array of modulators can be placed in front of where a standard source for achieving partial coherence is located in a conventional steppers (or scanners). The resulting illuminator of the instant invention is quite flexible because it allows for the easy rearrangment of the illumination zones so as to, for example, compensate for aberrations in the total optical system. It also allows for a very flexible approach to achieving various shapes of illumination such as quadrapole illumination.

The illumination system of the instant invention may also comprise a two-dimensional array of semiconductor lasers in the form of Vertical Cavity Surface Emitting Lasers (VCSELs) or an array of bonded edge emitting DFB lasers. VCSELs have the ability of providing, in a very small area, a large number of micro lasers defined by lithographic techniques. Originally such lasers were predominantly limited to the 690–900 nm wavelength. However, the lasers in this wavelength regime have exceptional power and conversion efficiency with power outputs of as high as 15 mW and conversion efficiencies as high as 20% at room temperature for a 20 micron diameter device. Recently, GaN lasers have been produced that lase at approximately 360 nm at room temperature. VCSEL's based on GaN have been proposed.

The expected intensity from such lasers can be determined by the currently available GaN LEDs which at 525 nm have a luminosity of 6 Candela which is 60 times the brightness of the brightest Red LEDs currently available. These LEDs arranged in an array at lower wavelength may also be used as an individual source of the instant invention.

These LEDS have much higher efficiency than Hg lamps since these LEDs already have efficiency of around 2% which is more than an order of magnitude better than any incandescent source.

Furthermore, another option for the individual sources of the instant invention is the second harmonic generation from VCSELs in the 690 nm regime. Such devices have been shown to operate at 482 nm from a pump source of 965 nm.

Figure 2:
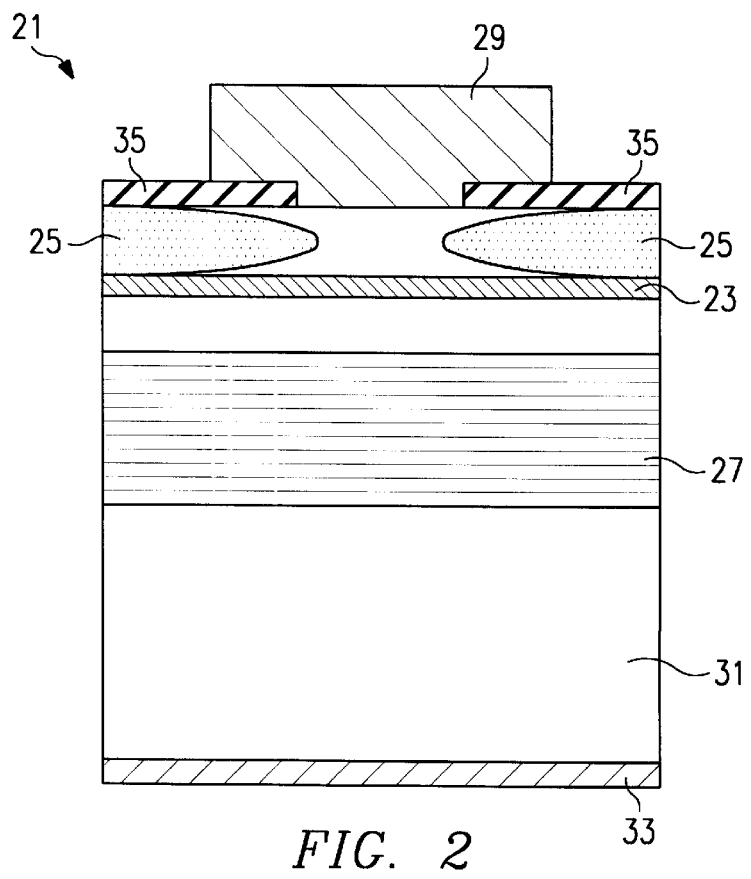
FIG. 2 is a schematic illustration of a VCSEL.

An example of a VCSEL structure is shown in FIG. 2. The active layer 23 has a GaAs/InGaAs MQW structure in which the wells are InGaAs to provide lasing of a fundamental light at a wavelength of approximately one micron. The spacer layers 25 are preferably AlGaAs. The bottom mirror 27 is an AlAs/GaAs semiconductor DBR mirror and the top mirror 29 is a $SiO_2/TiO_2$ dielectric DBR mirror which has a high transmission at the second-harmonic wavelength. The substrate 31 is a GaAs substrate. At the bottom and top are n-contact and p-contact metal layers 33 and 35, respectively.

The optical illumination system of the instant invention can readily form illuminator configurations optimized for the printing of two-dimensional, periodic patterns for semiconductor devices (such as DRAMS, Logic circuits, digital processor, and other types of devices).

For example, microlithography for DRAM patterns requires the printing of periodic features to form memory cells. This periodicity can be exploited by studying its behavior in the pupil plane of a projection tool. For pitches approaching the resolution limit of the stepper, the illuminator shape can be optimized to achieve better contrast and depth of focus. The optimized shape depends on stepper parameters such as numerical aperture of the projection lens (NA) and wavelength ($\lambda$), and mask parameters such as pitch and phase assignment. It is readily implemented by the illumination system of the instant invention.

Figure 3:
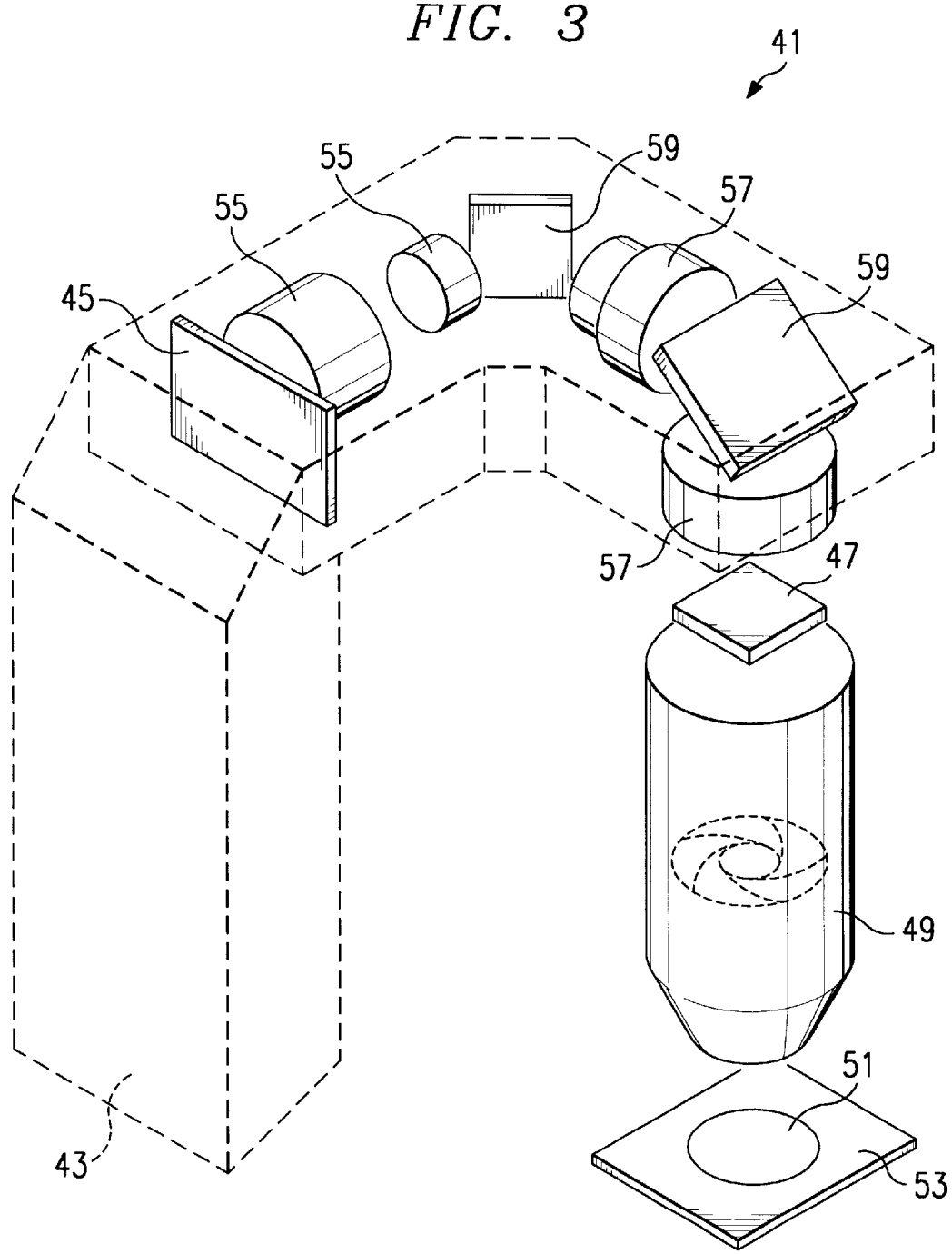
FIG. 3 is an illustration of an exposure apparatus according to the present invention.

The optical illumination system in accordance with the invention can also advantageously be used in existing exposure apparatus to replace the existing illumination system. FIG. 3 illustrates a known exposure apparatus 41 wherein the old illumination system 43 is replaced by the new illumination system in accordance with the instant invention. The illumination means 45 of the new system comprises the illumination system of the instant invention. The exposure apparatus 41 further comprises a mask and its holder 47 and an imaging lens 49 for transferring the pattern of the mask onto a wafer 51. The wafer rests on a movable stage 53. In the case of a stepper, the holder 47 and the stage 53 are stationary during the exposure of a particular mask on the wafer. In the case of a scanner, the holder 47 and the stage 53 move simultaneously during such an exposure. The exposure apparatus further comprises lenses 55 and 57 and mirrors 59 for irradiating the mask with the light beams.

Although the invention has been elucidated on the basis of the accompanying drawings in the discussion to his point, it should be noted that the invention is in no way restricted to just the embodiments depicted in the drawings. The invention also encompasses all the derivative embodiments which differ from the depicted embodiments within the scope defined in the claims. As an example, the light sources can be an array of any individually addressable point like sources such as one end of a bundle of optical fibers having the other end coupled to the output of a powerful laser.

We claim:

1. An optical illuminating system for transferring a pattern on a mask onto a wafer, said optical illumination system comprising:

a plurality of controllable light sources, each said light source capable of emitting an individual light beam along a beam path to provide a light beam along said beam path which is a composite of the light beams from said light sources which are emitting light at any instant in time and has a shape determined by the light beam from each of said plurality of light sources;

a controller coupled to each of said light sources, said controller independently controlling the light output of each of said light sources relative to the other of said light sources to control the shape of said composite light beam emanating from said light sources; and a lens system for directing said composite light beam to said mask, said lens system comprising at least one lens element positioned in the paths of all of said individual light beams.

2. The optical illumiation system of claim 1, wherein said light sources are individually addressable point light sources.

3. The optical illumination system of claim 1, wherein said plurality of light sources is comprised of a matrix addressable array of electro-optic modulators.

4. The optical illumination system according of claim 3, wherein the electro-optic modulators are comprised of LCD modulators.

5. The optical illumination system of claim 1, wherein said plurality of light sources is an array of semiconductor lasers.

6. The optical illumination system of claim 5, wherein the array of semiconductor lasers is an array of Vertical Cavity Surface Emitting Lasers.

7. An optical illuminating system for transferring a pattern on a mask onto a wafer, said optical illumination system comprising:

illumination means comprised of a plurality of light sources for emitting light beams along beam paths; and a lens system for providing said light beams to said mask, said lens system comprising at least one lens element positioned in the beams paths;

wherein said plurality of light sources is an array of bonded edge emitting DFB lasers.

8. An exposure apparatus for forming a pattern on a photoresist layer formed over a semiconductor substrate, said exposure apparatus comprising:

illumination means for illuminating a mask in the exposure apparatus, said illumination means comprising a plurality of point light sources, each of said light sources capable of emitting an individual energy beam along a beam path to provide an energy beam along said beam path which is a composite of the energy beams from said light sources which are emitting energy at any instant in time and has a shape determined by the light beam from each of said plurality of light sources;

a controller coupled to each of said light sources, said controller independently controlling the energy output of each of said light sources relative to the other of said light sources to control the shape of said composite energy beam emanating from said light sources; and a lens system for directing said composite light beam to said mask to transfer the pattern of the mask onto the photoresist layer, said lens system comprising a lens element disposed in said path of said composite light beam.

9. The exposure apparatus of claim 8, wherein said plurality of light sources is a matrix addressable array of electro-optic modulators.

10. The exposure apparatus of claim 9, wherein the electro-optic modulators are comprised of LCD modulators.

11. The exposure apparatus of claim 8, wherein said plurality of light sources is an array of semiconductor lasers.

12. The exposure apparatus of claim 11, wherein the array of semiconductor lasers is an array of Vertical Cavity Surface Emitting Lasers.

13. An exposure apparatus for forming a pattern on a photoresist layer formed over a semiconductor substrate, said exposure apparatus comprising:

illumination means for illuminating a mask in the exposure apparatus, said illumination means comprising a plurality of light sources for emitting energy beams along beams paths;

a lens system for transferring the pattern of the mask onto the photoresist layer, said lens system comprising lens elements distributed along the beams paths;

and wherein said light sources are individually addressable point like sources;

wherein said plurality of light sources is an array of bonded edge emitting DFB lasers.

* * * * *